(12) United States Patent
Thiele et al.

(10) Patent No.: US 11,095,813 B2
(45) Date of Patent: Aug. 17, 2021

(54) METHOD OF FABRICATING A MULTI-APERTURE SYSTEM FOR FOVEATED IMAGING AND CORRESPONDING MULTI-APERTURE SYSTEM

(71) Applicant: Baden-Württemberg Stiftung gGmbH, Stuttgart (DE)

(72) Inventors: Simon Thiele, Stuttgart (DE); Harald Giessen, Marnheim (DE); Timo Gissibl, Leonberg (DE); Kathrin Arzenbacher, Umkirch (DE); Alois M. Herkommer, Aalen (DE)

(73) Assignee: Baden-Wuerttemberg Stiftung gGmbH, Stuttgart (DE)

( * ) Notice: Subject to any disclaimer, the term of this patent is extended or adjusted under 35 U.S.C. 154(b) by 0 days.

(21) Appl. No.: 16/342,786

(22) PCT Filed: Oct. 18, 2016

(86) PCT No.: PCT/EP2016/001721
§ 371 (c)(1),
(2) Date: Apr. 17, 2019

(87) PCT Pub. No.: WO2018/072806
PCT Pub. Date: Apr. 26, 2018

(65) Prior Publication Data
US 2019/0260927 A1    Aug. 22, 2019

(51) Int. Cl.
*H04N 5/232*    (2006.01)
*B33Y 80/00*    (2015.01)
(Continued)

(52) U.S. Cl.
CPC .......... *H04N 5/23232* (2013.01); *B33Y 80/00* (2014.12); *G02B 27/1066* (2013.01);
(Continued)

(58) Field of Classification Search
CPC ............. H04N 5/23232; H04N 5/2254; H04N 5/2253; H04N 13/243; H04N 5/23238;
(Continued)

(56) References Cited

U.S. PATENT DOCUMENTS 8,908,054 B1 * 12/2014 Koenck ............ H04N 5/232123
                                                        348/218.1
10,288,775 B1 * 5/2019 Keith ........................ G01J 3/02
(Continued)

FOREIGN PATENT DOCUMENTS

WO      2015050499 A1    4/2015

OTHER PUBLICATIONS

Timo Gissibl et al: "Two-photon direct laser writing of ultracompact multi-lens objectives", Nature Photonics, vol. 10, No. 8, Jun. 27, 2016 (Jun. 27, 2016), pp. 554-569, XP055362297, UK. ISSN: 1749-4885, DOI:10.1038/nphoton.2016.121.
(Continued)

*Primary Examiner* — Lin Ye
*Assistant Examiner* — Tuan H Le
(74) *Attorney, Agent, or Firm* — Shook, Hardy & Bacon L.L.P.

(57) ABSTRACT multi-aperture system for foveated imaging as well as to a corresponding multi-aperture system. The method comprises the steps of:
    providing an image sensor; and
    forming, by means of a 3D-printing technique, at least two imaging elements directly on the image sensor such that the imaging elements have a common focal plane located on the image sensor and each imaging element has a different focal length and field of view.

15 Claims, 7 Drawing Sheets

(51) Int. Cl.
  *G03F 7/00* (2006.01)
  *H04N 5/225* (2006.01)
  *G02B 27/10* (2006.01)
  *B33Y 10/00* (2015.01)
  *B29D 11/00* (2006.01)

(52) U.S. Cl.
  CPC ......... *G03F 7/0015* (2013.01); *H04N 5/2253* (2013.01); *H04N 5/2254* (2013.01); *B29D 11/00403* (2013.01); *B33Y 10/00* (2014.12)

(58) Field of Classification Search
  CPC .. H04N 5/247; H04N 5/23296; H04N 5/3696; H04N 17/002; H04N 5/2258; H04N 5/265; H04N 9/04557; H04N 13/232; H04N 13/257; H04N 2013/0081; G02B 27/1066; G02B 3/0056; G02B 3/0062; G02B 13/02; B33Y 80/00; B33Y 10/00; G03F 7/0015; B29D 11/00403; G06T 7/557; G06T 3/4053; G06T 2207/10052
  See application file for complete search history.

(56) References Cited

U.S. PATENT DOCUMENTS

| | | | |
|---|---|---|---|
| 2008/0174670 A1* | 7/2008 | Olsen | H04N 5/2624 348/222.1 |
| 2011/0176020 A1* | 7/2011 | Chang | G03B 17/12 348/222.1 |
| 2015/0116527 A1* | 4/2015 | Rossi | H04N 5/2254 348/218.1 |
| 2018/0039142 A1* | 2/2018 | Tang | G02F 1/133308 |

OTHER PUBLICATIONS

International Search Report and Written Opinion dated Apr. 18, 2017 in International Patent Application No. PCT/EP2016/001721, 16 pages.

Ottevaere, H., et al.,"Photonics-enhanced smart imaging systems", Proceedings of SPIE, vol. 9971, pp. 1-10, (2016). DOI: 10.1117/12.2239.

Office Action received for European Patent Application No. 16791519.8, dated Feb. 25, 2021, 6 pages.

* cited by examiner

METHOD OF FABRICATING A MULTI-APERTURE SYSTEM FOR FOVEATED IMAGING AND CORRESPONDING MULTI-APERTURE SYSTEM

CROSS-REFERENCE TO RELATED APPLICATIONS

This application is a 35 U.S.C. § 371 national stage application of PCT Application Number PCT/EP2016/001721, filed Oct. 18, 2016, and entitled "Method Of Fabricating A Multi-aperture System For Foveated Imaging And Corresponding Multi-aperture System". The entirety of the aforementioned application is incorporated by reference herein.

DESCRIPTION

The present invention relates to a method of fabricating a multi-aperture system for foveated imaging as well as to a corresponding multi-aperture system.

A frequent technical problem of planar sensor arrays for imaging systems is the limitation of the spatial bandwidth or content of information by the size of individual pixels. At the same time, many applications or tasks do not require an equal distribution of details over the whole field of view (FOV). An example is a guided camera which is usually targeted at a target in order to image the target with a maximal resolution. The neighborhood of the target is less important in view of details but should nevertheless be observable. For this purpose, the eyes of animals, especially predators, are configured such that they have a significant higher density of light sensitive cells in the center of the so-called fovea. Thereby, the central area of the field of view, i.e. the central area near the optical axis, exhibits the highest resolution.

This is the same in humans, where the cones in the eye are located at the fovea which gives the highest acuity in vision—hence the term "foveated imaging" has been established. In eagles, this physiological effect is particularly pronounced, which is why foveated imaging is also sometimes called "eagle eye vision".

Similarly, technical applications such as drone cameras, robotic vision, vision sensors for autonomous cars or other movable systems benefit from a higher information density at the center of their field of view.

Foveated imaging systems, i.e. imaging systems with a higher resolution and/or information bandwidth in the central region of the field of view compared to the resolution and/or information bandwidth at the peripheral region, are of particular relevance if the information bandwidth is limited by the size of detector pixels or by the read-out time. In such cases, an optimum distribution of details on the limited spatial or temporal bandwidth becomes essential.

Foveated imaging is generally known and also realized by using multi-aperture cameras. However, such conventional cameras for foveated imaging are relatively complex due to the need of a plurality of optical components that have to be carefully aligned and adjusted to each other. As a consequence, conventional foveated imaging systems are limited in view of miniaturization. Moreover, the fabrication process is complex and expensive.

Thus, it is an object of the present invention to overcome the above mentioned drawbacks and to provide an improved method of fabricating a multi-aperture system for foveated imaging as well as a corresponding multi-aperture system.

This object is solved by the subject-matter of the independent claims. Preferred embodiments are subject to the dependent claims.

According to one aspect of the present invention, a method of fabricating a multi-aperture system for foveated imaging is provided. The method comprises the steps of:
providing an image sensor; and
forming, by means of a three-dimensional (3D)-printing technique, at least two imaging elements directly on the image sensor such that the imaging elements have a common focal plane located on the image sensor and each imaging element has a different focal length and field of view.

As it is known by a skilled person and as already mentioned above, "foveated imaging" means that the information density, the information bandwidth and/or the resolution in a central region of the field of view or of a resulting image is higher than in a peripheral region of the field of view or the resulting image. In other words, "foveated imaging" means that the information density, the information bandwidth and/or the resolution is redistributed such that in the central region of the image more details are transferred than in the peripheral or outer region of the image.

In order to allow foveated imaging, an image sensor is provided and at least two imaging elements with different focal lengths and/or different fields of view are formed on the image sensor. Within the present invention, the term "forming" particularly means or encompasses a "three dimensional (3D)-printing". Accordingly, the step of "forming, by means of a 3D-printing technique, at least two imaging elements directly on the image sensor" may also be formulated as "3D-printing of at least two imaging elements directly onto the image sensor".

The focal length and/or the field of view of any one of the at least two imaging elements differ from the focal lengths and/or the fields of view of the other or remaining imaging elements. The focal length of each of the imaging elements may be smaller than 260 µm.

The image sensor may be a conventional image sensor, such as a CCD- or CMOS sensor, having a constant pixel distance or constant pixel pitch. The at least two imaging elements may be or may comprise at least two objectives, particularly multi-lens systems or multi-lens objectives such as doublet- or triplet-lens objectives.

The at least two imaging elements are formed directly on the image sensor by means of a 3D-printing technique. In particular, the at least two imaging elements are formed directly on a surface of the image sensor. In other words, the formation of the at least two imaging elements is performed directly on the image sensor by means of a 3D-printer. In still other words, the formation of the at least two imaging elements comprises a direct 3D-printing of the at least two imaging elements on the image sensor. As a 3D-printing technique, femtosecond direct laser writing and in particular a three-dimensional dip-in multiphoton laser lithography may be used.

Within the present invention, it has surprisingly found out that a direct 3D-print of imaging elements on an image sensor is possible in order to fabricate a micro-scale multi-aperture system for foveated imaging, wherein images with different magnifications can be combined or synthesized. In particular, the present invention offers the combination of complex micro-imaging optics which, directly printed on an image sensor, can record images with a spatially varying information density, i.e. with a spatially varying resolution. In other words, the present disclosure provides the fabrication of 3D-printed microoptics or 3D-printed imaging elements by a direct print on a chip or an image sensor, which can be used for foveated imaging in that images with different magnifications are generated and synthesized.

Due to the suprisingly high quality of the imaging elements which are directly 3D-printed on the image sensor, the optical performance and the possible miniaturzation is merely or mainly limited by the size of the detector pixels of the image sensor. Thus, compared to conventional fabrication methods such as micro precision machining, nanoimprint lithography or traditional wafer-level approaches, foveated imaging systems can be fabricated with a higher degree of miniaturization by using the method according to the present invention. In other words, the degree of minituriazation which can be achieved by the method according to the present invention cannot be achieved, at least in the same complecity and/or quality, by conventional fabrication techniques. In particular, the dimensions of foveated imaging systems fabricated by the method according to the present invention can be at least one order of magnitude smaller than those fabricated with conventional methods. With the high miniaturization, new fields of applications such as cameras for midget drones or sensors for endoscopy, in which no foveated imaging systems have been possible so far, are made accessible.

Moreover, compared to traditional fabrication methods such as micro precision machining, nanoimprint lithography or traditional wafer-level approaches, the method according to the present invention advantageously allows an almost unrestricted design freedom and a one-step fabrication without the necessity for subsequent assembly, alignment and/or adjustment of different components. In particular, the present invention offers the possibility to fabricate strongly varying components with overlaps and/or undercuts in one single step. This is not possible using conventional fabrication methods. All problems that are related to a precise assemly, alignment and/or adjustment of components, which is especially crucial for small or microscopic systems, can be avoided by the direct 3D-printing on the image sensor according to the present invention.

In a preferred embodiment, the forming the at least two imaging elements is performed in one single 3D-printing step. In particular, before the 3D-printing step, a multi aperture optics, particularly a multi aperture micro-optics, which comprises the at least two imaging elements, is designed. This multi-aperture optics or micro-optics is then 3D-printed in a single step. This ensures a high degree of reliability of the fabrication process and thus also a high quality. Furthermore, the fabrication costs can be reduced.

In a further preferred embodiment, the forming the at least two imaging elements comprises forming at least one discharge opening or aperture in each of the imaging elements so that an unexposed photoresist, which is used for the 3D-printing, is able to discharge or can be removed after the 3D-printing. In this manner, it can be avoided that any unexposed photoresist deteriorates the functionality of the imaging elements. Accordingly, the quality of the imaging elements can be improved. Generally, the discharge openings shall be as large as possible in order to ensure that the unexposed photoresist or at least a substantial part of it can discharge. Preferably, the discharge openings are formed such that a diameter, particularly a width and/or a height, of a discharge opening is larger than a depth of the discharge opening. This results in an effective discharge of the unexposed photoresist.

In a further preferred embodiment, the forming the at least two imaging elements comprises forming at least two multiple-lens objectives. In particular, the imaging elements may be or comprise doublet-lens objectives, triplet-lens objectives or even more lens elements for aberration correction. Multi-lens objectives offer significant advantages and are crucial for the imaging performance. On the one hand, pupil positions and focal lengths can be changed independently which allows for real telephoto and retrofocus systems. On the other hand, aberrations such as field curvature, astigmatism, spherical aberration, and distortion can be corrected effectively. Since the imaging elements are formed by 3D-printing, aspheric interfaces up to the $10^{th}$ order may be used, which facilitates the fabrication of multi-lens objectives.

The forming the at least two imaging elements may further comprise forming anti-reflection coatings, either by coatings or by nanostructuring. In particular, anti-reflection coatings on the imaging elements or lenses may be formed by 3D-printing. Preferably, such antireflection coatings are formed in a single 3D-printing step, i.e. together with the formation of the imaging elements.

In a further preferred embodiment, the image sensor is pre-processed before the at least two imaging elements are formed by 3D-printing. The pre-processing of the image sensor preferably comprises a removal of functional elements of the image sensor. In other words, functional elements that are disposed on the image sensor may be removed before the at least two imaging elements are formed. Functional elements in the sense of the present invention may be elements such as filters or micro-lenses, which may provide distinct functionalities of the image sensor and/or improve the quality of the image sensor. Within the present invention, it turned out that such functional elements may significantly deteriorate the 3D-printing step. However, by pre-processing or "cleaning" the image sensor, i.e. particularly by removing the functional elements, if any, from the image sensor before performing the 3D-printing step, the quality of the 3D-printing and thus the quality of the imaging elements and/or the multi-aperture system can be significantly improved. In particular, the pre-processing step may significantly improve the adhesion of the imaging elements on the image sensor.

Further preferably, the image sensor is first soldered and/or wired before the 3D-printing is performed. Otherwise, the 3D-printed imaging elements may be deteriorated or destroyed when soldering and/or wiring is performed after the 3D-printing, i.e. after the imaging elements have been formed. Furthermore, the image sensor may be pre-processed or prepared such that no structures or elements of the image sensor, which are higher than a working distance of the 3D-printer or its writing objective, protrude from the surface of the image sensor, on which the imaging elements are to be formed.

In a further preferred embodiment, the at least two imaging elements are formed such that each of the at least two imaging elements has dimensions, in particular a diameter and/or a length, of less than 800 µm, preferably of less than 400 µm and more preferably of less than 200 µm. For example, the imaging elements are formed as pillars. In particular, each imaging element may occupy an area on the image sensor that is equal to $\pi * (d/2)^2$, wherein d is the diameter of the imaging element and wherein d preferably has the above mentioned values. Additionally or alternatively, the at least two imaging elements are formed such that the at least two imaging elements occupy an area on the image sensor that is smaller than 1000×1000 µm², preferably smaller than 600×600 µm², more preferably smaller than 400×400 µm², and in particular smaller than 200×200 µm².

In other words, each of the at least two imaging elements has microscopic dimensions and/or is a microscopic objective. In still other words, at least two microscopic imaging elements may be formed by the 3D-printing step. Within the present disclosure, the term "microscopic" means that the dimensions of the imaging elements are so small that these dimensions cannot be achieved by a conventional fabrication method, i.e. without using a 3D-printing technique.

In a further preferred embodiment, the forming the at least two imaging elements comprises forming four imaging elements or objectives that are arranged in a 2×2 arrangement. In particular, two of the four imaging elements are arranged in one row and the other two of the four imaging elements are arranged in a second row, wherein the second row is parallel to the first row. Preferably, the four imaging elements are formed such that they occupy a total area on the image sensor of less than 1000×1000 µm², more preferably of less than 600×600 µm², still more preferably of less than 400×400 µm² and most preferably of less than 200×200 µm². The imaging elements may for example be aberration corrected air-spaced doublet objectives.

In a preferred embodiment, a CCD-sensor or a CMOS-sensor is provided as the image sensor. The image sensor may have a dimension of less than 1×1 mm².

According to a further aspect of the present invention, a multi-aperture system or a multi-aperture camera for foveated imaging is provided. The multi-aperture system comprises:

an image sensor; and
at least two imaging elements which are directly formed on the image sensor by means of a 3D-printing technique, wherein the imaging elements have a common focal plane located on the image sensor and each imaging element has a different focal length and field of view.

Contrary to conventional foveated imaging systems, the imaging elements according to the present invention are 3D-printed imaging elements, i.e. imaging elements directly printed onto the image sensor by means of a 3D-printing technique.

In a preferred embodiment, the image sensor comprises or is a CCD-sensor or a CMOS-sensor.

In a further preferred embodiment, each imaging element comprises at least one discharge opening so that an unexposed photoresist is able to discharge after the 3D-printing.

In a further preferred embodiment, each of the at least two imaging elements has dimensions, in particular a diameter and/or a length, of less than 800 µm, preferably of less than 400 µm and more preferably of less than 200 µm. For example, the shape of each imaging element is a pillar. In particular, each imaging element may occupy an area on the image sensor that is equal to $\pi * (d/2)^2$, wherein d is the diameter of the imaging element and wherein d preferably has the above mentioned values. Additionally or alternatively, the at least two imaging elements occupy an area on the image sensor that is smaller than 1000×1000 µm², preferably smaller than 600×600 µm², more preferably smaller than 400×400 µm², and in particular smaller than 200×200 µm². In other words, each of the at least two imaging elements has microscopic dimensions and/or is a microscopic objective.

In a further preferred embodiment, the at least two imaging elements comprise four imaging elements or objectives arranged in a 2×2 arrangement, wherein the four imaging elements preferably occupy a total area on the image sensor of less than 1000×1000 µm², more preferably of less than 600×600 µm², still more preferably of less than 400×400 µm², and most preferably of less than 200×200 µm².

In a further preferred embodiment, the multi-aperture foveated imaging system further comprises a processor for processing and/or combining individual images captured by the at least two imaging elements. In particular each individual image has a different resolution due to the different focal lengths and/or different fields of view.

In a further preferred embodiment, the processor is configured to process the individual images and generate a resulting image such that in a central area of the resulting image, i.e. an area near the optical axis of the multi-aperture system, the information density or resolution is higher compared to an outer or peripheral area of the resulting image.

In particular, the processing of the individual images comprises a scaling and overlaying of the individual images. The resulting image may also be referred to as superior image and/or foveated image. The totally available bandwidth may be optimized in that the central area of the resulting image, which may relate to the most important parts of the image, are transferred with a higher spatial bandwidth and/or resolution compared to the outer or peripheral areas of the image, which may relate to the less important parts of the image.

For the above mentioned further independent aspect and in particular for preferred embodiments in this regard, the explanations given above or below concerning the embodiments of the first aspect also hold true. In particular, for one independent aspect of the present invention and for preferred embodiments in this regard, the explanations given above and below concerning the embodiments of the respective other aspects also hold true.

Individual embodiments for solving the problem are described by way of example below with reference to the figures. In this case, the individual embodiments described have in part features which are not absolutely necessary for implementing the claimed subject matter, but which provide desired properties in specific applications. In this regard embodiments which do not have all the features of the embodiments described below are also intended to be regarded as disclosed in a manner coming under the technical teaching described. Furthermore, in order to avoid unnecessary repetitions, specific features are mentioned only with regard to individual embodiments from among the embodiments described below. It is pointed out that the individual embodiments are therefore intended to be considered not only by themselves but also in a joint consideration. On the basis of this joint consideration the person skilled in the art will recognize that individual embodiments can also be modified by inclusion of individual or a plurality of features of other embodiments. It is pointed out that a systematic combination of the individual embodiments with individual or a plurality of features described with regard to other embodiments may be desirable and expedient and is therefore intended to be taken into account and also to be regarded as encompassed by the description.

BRIEF DESCRIPTION OF THE FIGURES

The above and other objects, features and advantages of the present invention will become more apparent upon reading of the following description of preferred embodiments and accompanying drawings. Other features and advantages of the subject-matter described herein will be apparent from the description and the drawings and from the claims. It should be understood that even though embodiments are separately described, single features and functionalities thereof may be combined without prejudice to additional embodiments. The present disclosure is illustrated by way of example and not limited by the accompanying figures.

Preferred embodiments of the present invention are exemplarily described regarding the following figures:

FIG. 5(a) shows the imaging through a single compound lens with 70° field of view. FIG. 5(b) shows foveated images for four different lenses with fields of view of 20°, 40°, 60° and 70°. The measurement for (a) and (b) was done on a glass substrate. FIG. 5(c) shows the same as FIG. 5(a) but simulated and measured on a CMOS image sensor with 1.4×1.4 µm² pixel size. FIG. 5(d) shows foveated results from the CMOS image sensor.

FIG. 6(a) shows a comparison of the test picture "Lena", taken with the eagle-eye camera and FIG. 6(b) shows the imaging performance for a Siemens star test target.

It is noted that FIGS. 3 and 5 to 7 include photographs which are helpful to illustrate and understand the present invention. These figures cannot be presented otherwise, e.g. as line drawings.

DETAILED DESCRIPTION OF THE FIGURES

The following detailed description relates to exemplary embodiments of the present invention. Other embodiments of the invention are possible within the scope of the invention as defined by the appended claims. Throughout the figures, same reference signs are used for the same or similar elements.

Figure 1A:
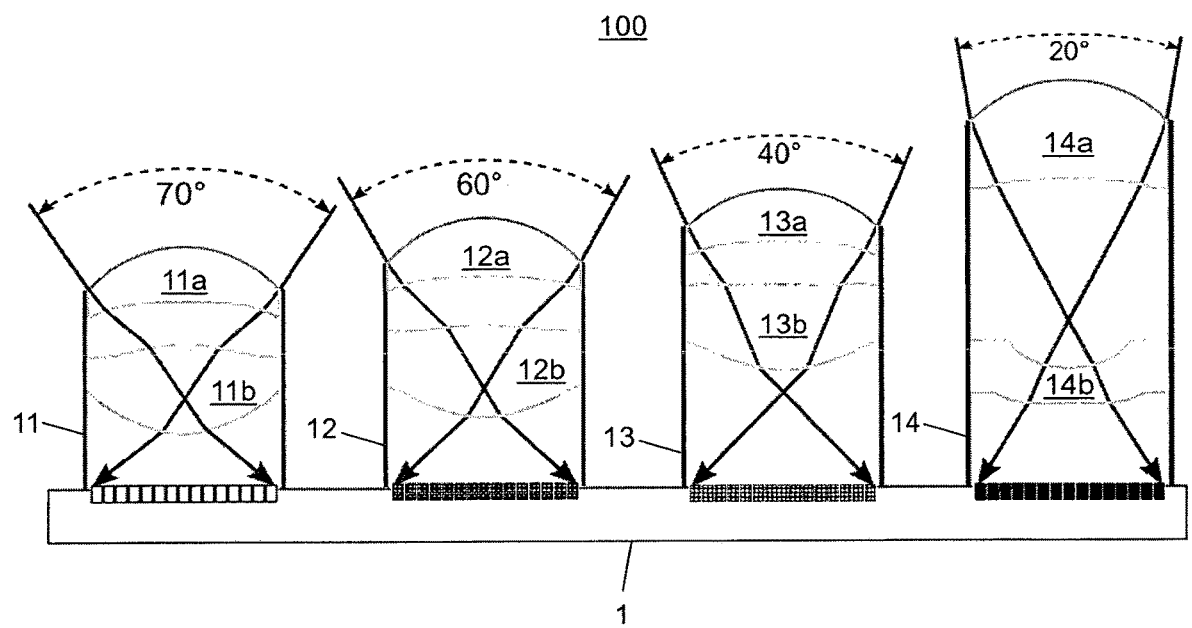
FIG. 1a shows a schematic representation of a multi-aperture system for foveated imaging according to an example.

FIG. 1a shows a schematic representation of a multi-aperture system 100 for foveated imaging according to an example. The multi-aperture system comprises a CMOS image sensor 1 and four different imaging elements 11, 12, 13 and 14 which are directly formed on the image sensor 1 by means of a 3D-printing technique. The imaging elements 11, 12, 13 and 14 have a common focal plane located on the image sensor 1 and each imaging element has a different field of view (FOV). In the example shown, imaging element 11 is a doublet objective comprising two lenses 11a and 11b and having a FOV of 70° as well as an equivalent focal lengths for 35 mm film of f=31 mm. Imaging element 12 is a doublet objective comprising two lenses 12a and 12b and having a FOV of 60° as well as an equivalent focal lengths for 35 mm film of f=38 mm. Imaging element 13 is a doublet objective comprising two lenses 13a and 13b and having a FOV of 40° as well as an equivalent focal lengths for 35 mm film of f=60 mm. And imaging element 14 is a doublet objective comprising two lenses 14a and 14b and having a FOV of 20° as well as an equivalent focal lengths for 35 mm film of f=123 mm. Accordingly, the multi-aperture system 100 comprising four different compound lenses, i.e. imaging elements 11, 12, 13 and 14, on the same CMOS image sensor 1 combine different field of views and focus lengths in one single system.

Due to the different fields of view, each imaging element 11, 12, 13 and 14 generates an image with a different information density or resolution. This is indicated in FIG. 1a by a distinct pattern drawn on the image sensor 1 for each imaging element. Imaging element 11 has the lowest resolution (indicated by a white pattern) and imaging element 14 has the highest resolution (indicated by a black pattern).

Figure 1B:
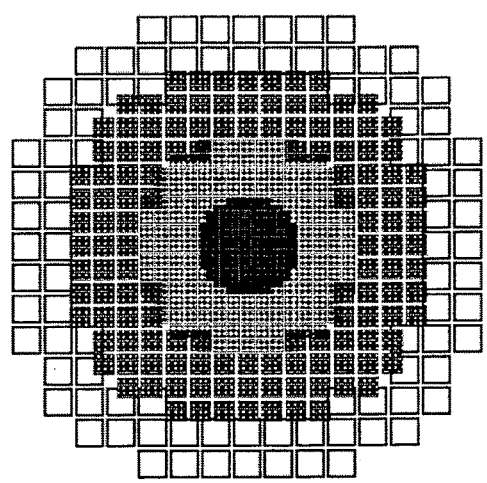
FIG. 1b shows a schematic representation of an exemplary fusion of pixel information to create a foveated image.

FIG. 1b shows a schematic representation of how the pixel information is subsequently fused to form a foveated image. Each imaging element 11, 12, 13 and 14 creates an image of the same lateral size on the image sensor 1. However, due to the varying fields of view, the telephoto lens (20° FOV) magnifies a small central section of the object field of the 70° lens. Appropriate scaling and overlaying of the images thus lead to the foveated image with increasing level of detail towards the center of the image.

As illustrated in FIG. 1b by means of different patterns which correspond to the patterns shown in FIG. 1a, the center of the foveated image has the highest resolution obtained by imaging element 14, while the outer or peripheral region of the foveated image has the lowest resolution obtained by imaging element 11. From the center to the outer region of the foveated image the resolution decreases in accordance with the resolutions of imaging element 13 and imaging element 12.

Figure 2A:
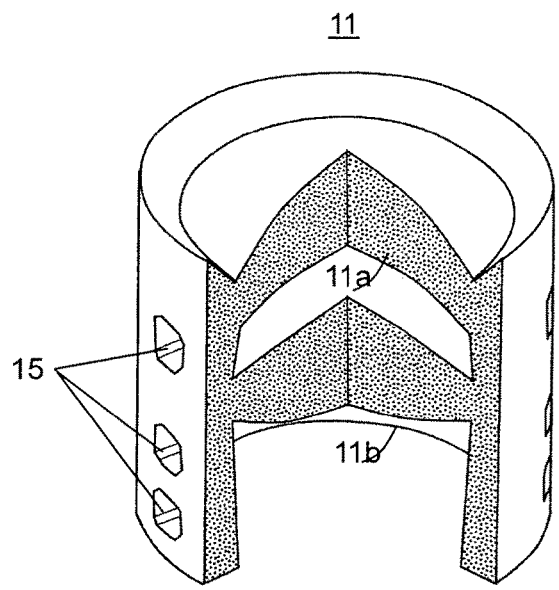
FIG. 2a is a sectional view of a schematic representation of an imaging element according to an example.

FIG. 2a is a sectional view of a schematic representation of an imaging element 11 according to an example. Imaging element 11 is a doublet lens system or a doublet objective comprising a first lens 11a and a second lens 11b. The individual freeform surfaces with higher-order aspherical corrections are clearly visible. Further, imaging element 11 comprises discharge openings 15 so that an unexposed photoresist is able to discharge after the 3D-printing.

Figure 2B:
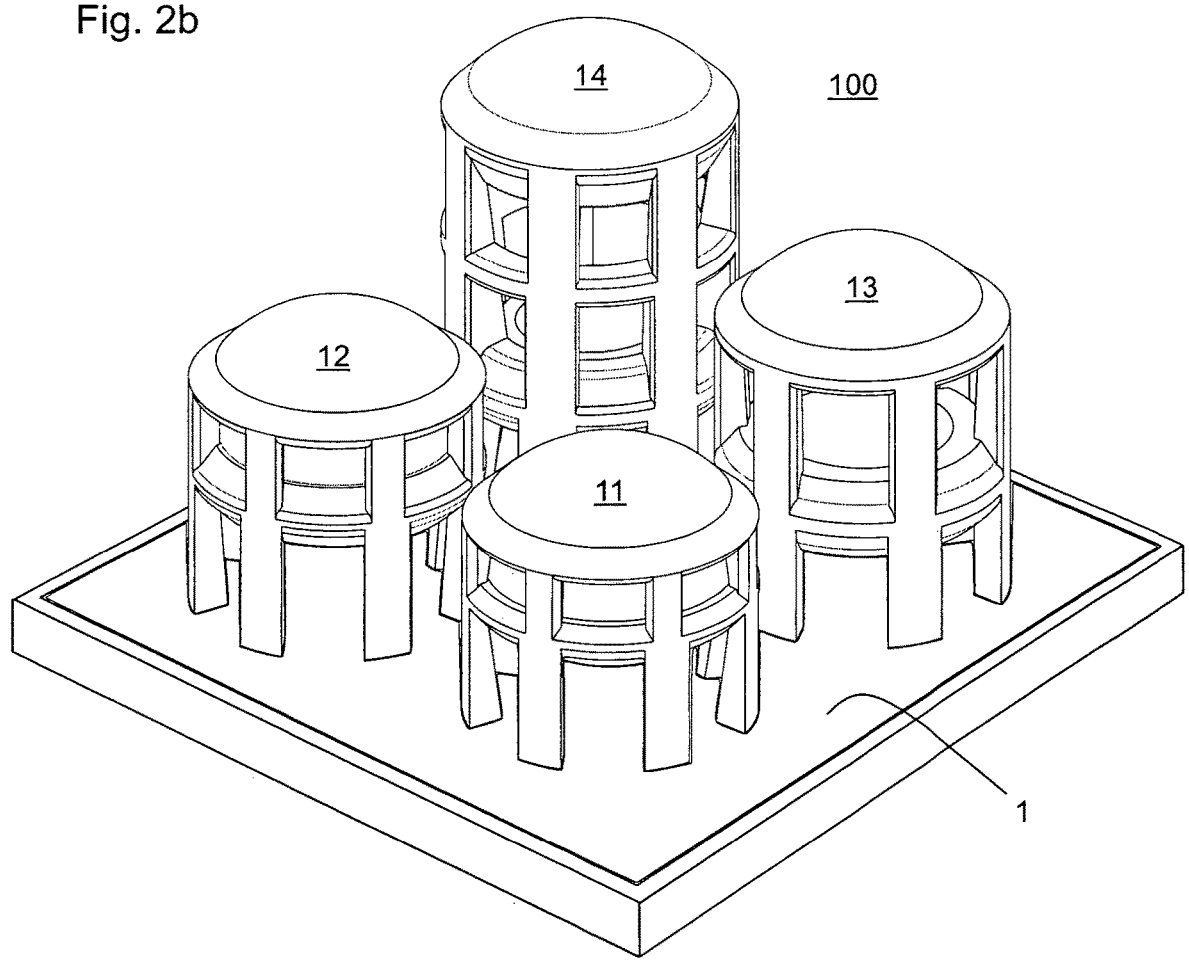
FIG. 2b shows a schematic representation of four imaging elements arranged in a 2×2 arrangement.

FIG. 2b shows a schematic representation of the multi-aperture system 100 comprising an image sensor 1, e.g. a CMOS image sensor, and four 3D-printed imaging elements 11, 12, 13 and 14, arranged in a 2×2 arrangement on the image sensor. In this preferred arrangement the imaging elements are arranged on the image sensor 1 to occupy an area with a rectangular or quadratic shape. While imaging elements 11 and 12 are arranged in a first row, imaging elements 13 and 14 are arranged in a second row, which is parallel to the first row. Such an arrangement is space-saving, especially when using small rectangular or quadratic image sensors. In particular, the multi-aperture design combines four aberration corrected air-spaced doublet objectives 11 to 14 with different focal lengths and a common focal plane which is situated on the image sensor 1. Particularly beneficial is the abilitiy to create aspherical freeform surfaces by means of a 3D-printing, which is heavily utilized in the lens design.

Figure 3:
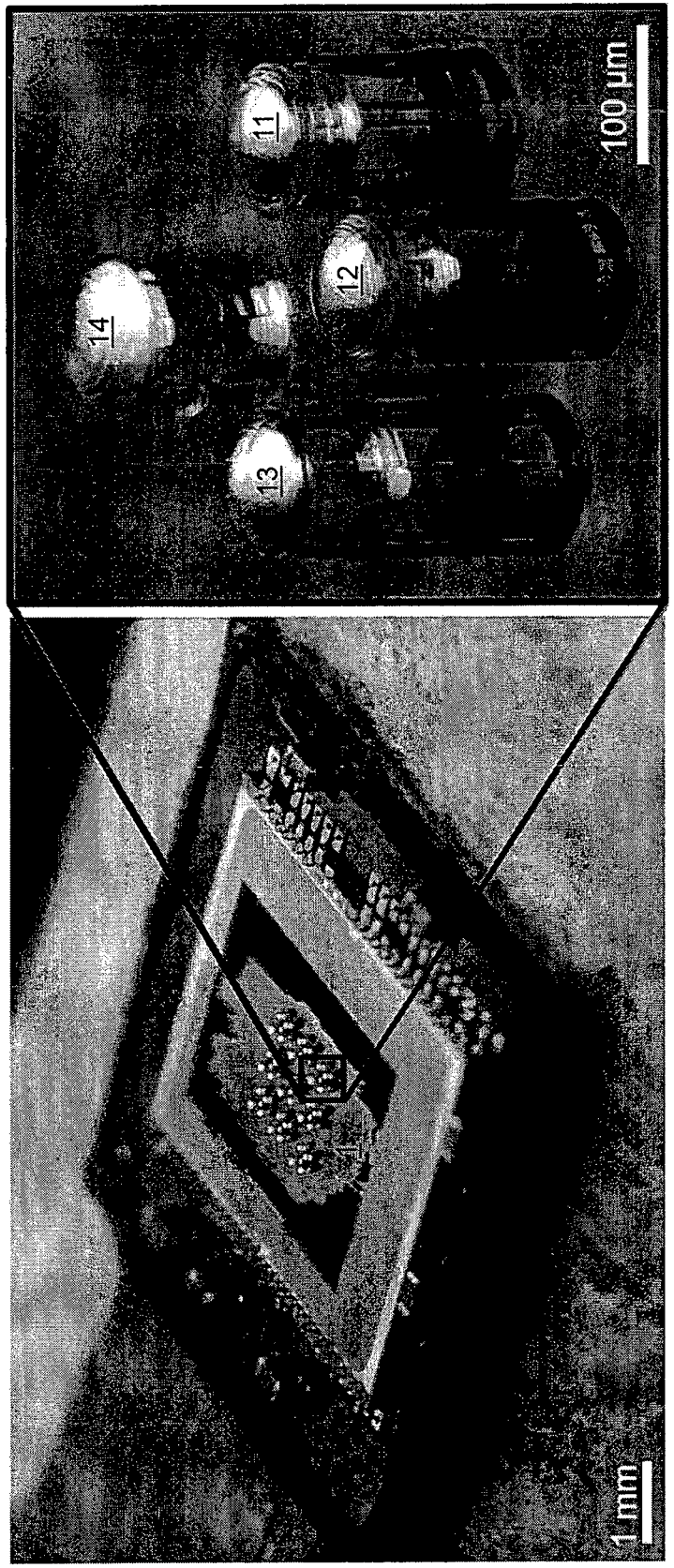
FIG. 3 shows on the left hand side a photograph of an image sensor with imaging elements directly printed onto the chip. On the right hand side, details of one lens group with four imaging elements forming one camera for foveated imaging are shown.

FIG. 3 depicts the image sensor 1 after 3D-printing multiple groups of the foveated imaging systems directly on the chip. The left hand side of FIG. 3 shows a photograph of image sensor 1 with a plurality of imaging elements directly printed onto the chip. On the right hand side of FIG. 3, details of one lens group with four imaging elements 11, 12, 13 and 14 forming one camera 100 for foveated imaging are shown.

FIG. 3 shows the sensor with 9 groups of the same four objectives 11 to 14. Each group forms its own foveated camera 100 and occupies a surface area of less than 300×300 µm². Preferably, the system is designed such that the four separate imaging elements 11 to 14 are closely merged into one single object which is then 3D-printed in one single step.

The highly miniaturized camera 100, mimicking the natural vision of predators, is fabricated by directly 3D-printing the different multi-lens objectives 11 to 14 onto the CMOS image sensor 1. Preferably, the system combines four printed doublet lenses with different focal lengths (equivalent to f=31 to 123 mm for 35 mm film) in a 2×2 arrangement to achieve a full field of view of 70° with an increasing angular resolution of up to 2 cycles/degree field of view in the center of the image. The footprint of the optics on the chip is below 300×300 µm², while their height is <200 µm. Since the four imaging elements 11 to 14 are printed in one single step without the necessity for any further assembling or alignment, this approach allows for fast design iterations and can lead to a plethora of different miniaturized multi-aperture imaging systems with applications in fields such as endoscopy, optical metrology, optical sensing, or security.

Figure 4:
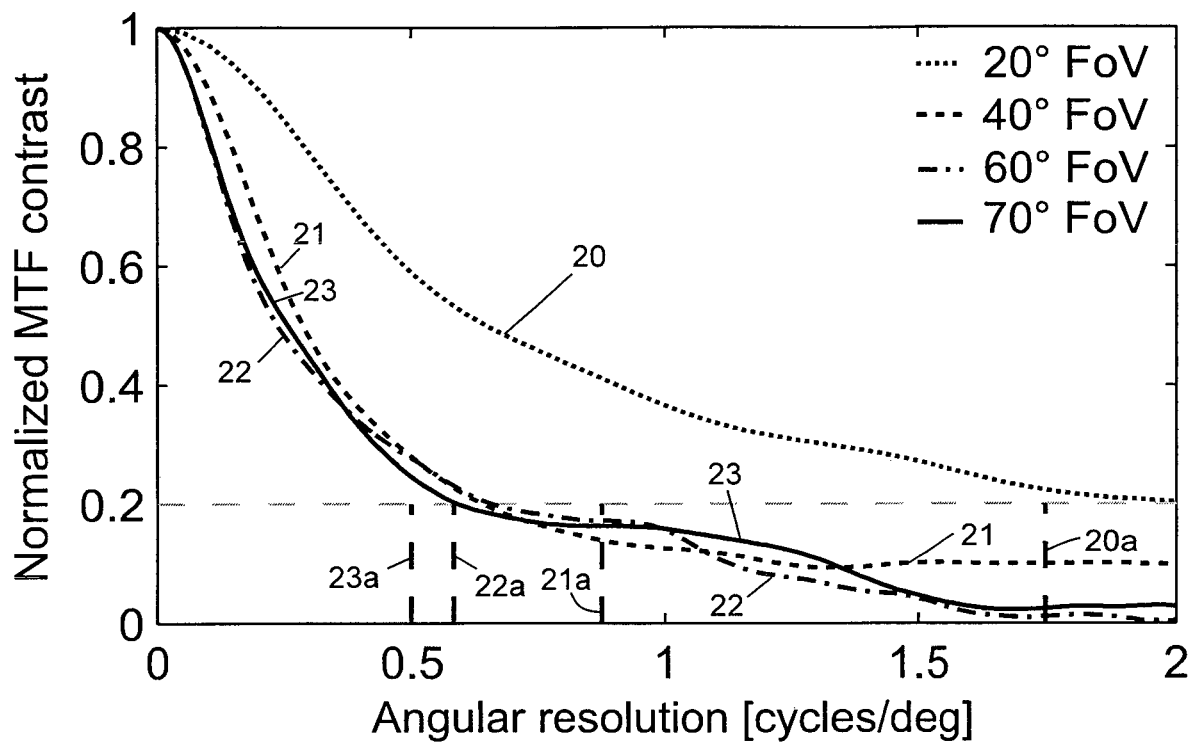
FIG. 4 shows a measured MTF contrast in object space as a function of angular resolution for four imaging elements, each having a different field of view.

FIG. 4 compares the normalized MTF contrast as a function of angular resolution in object space for the four different imaging elements after measurement with the knife edge method. Curve 20 corresponds to 20° FOV, curve 21 corresponds to 40° FOV, curve 22 corresponds to 60° FOV and curve 23 corresponds to 70° FOV. As expected, systems with longer focal lengths and smaller FOVs exhibit higher object space contrast at higher resolutions due to their telephoto zoom factor. The dashed vertical lines indicate the theoretical resolution limit due to the pixel pitch of the imaging sensor. Dashed line 20a corresponds to 20° FOV, dashed line 21a corresponds to 40° FOV, dashed line 22a corresponds to 60° FOV and dashed line 23a corresponds to 70° FOV. All systems deliver more than 10% of contrast at the physical limits of the sensor. It is noted that the data does not include the effects of the CMOS image sensor and is obtained by knife edge MTF measurements of the samples printed on a glass slide.

Figure 5:
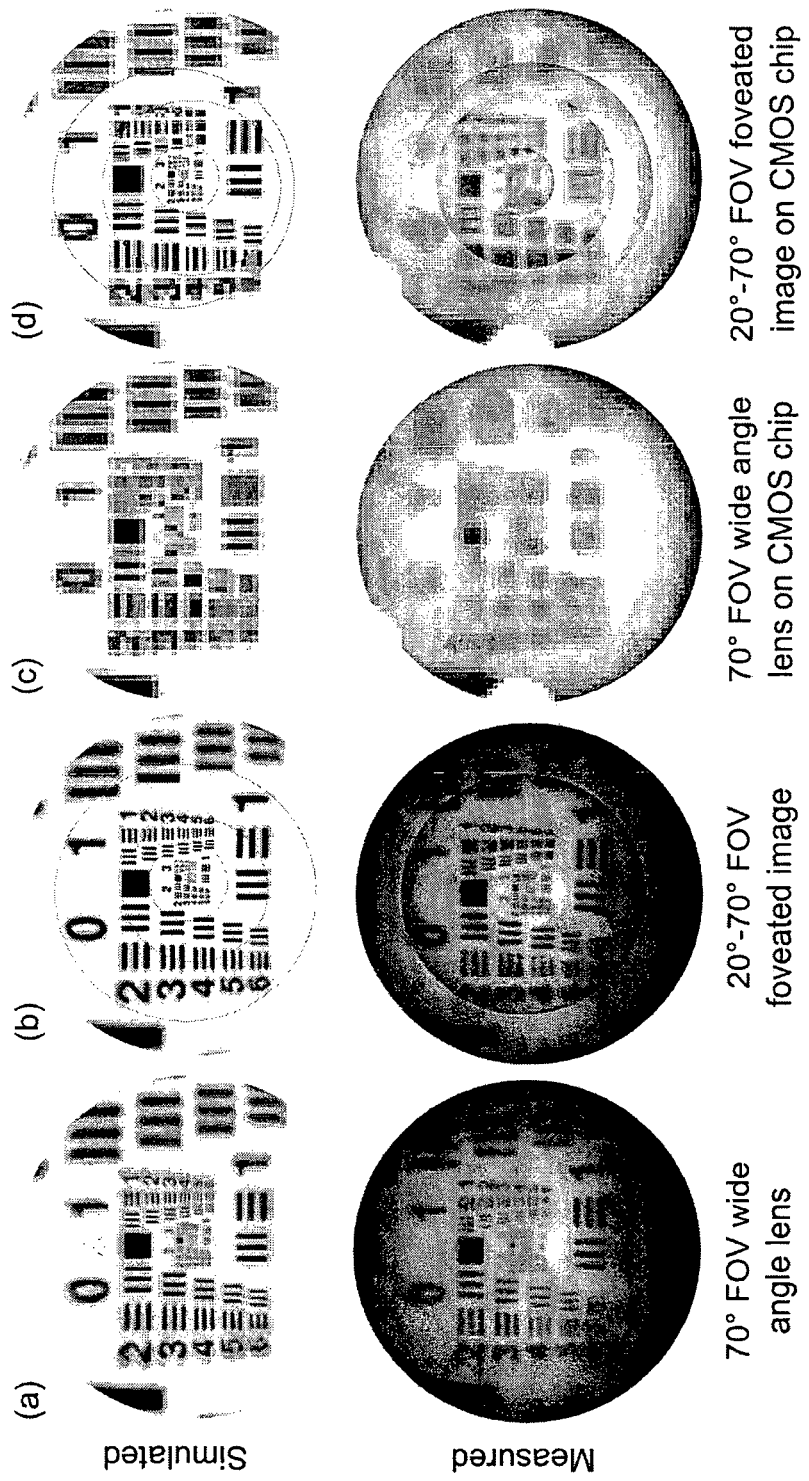
FIG. 5 is a photograph showing a comparison of simulation and measurement for foveated imaging systems fabricated by the method according to the present invention. In particular.

FIG. 5 depicts the simulated and measured results for four cases. FIG. 5a exhibits a comparison between measured and simulated imaging performance of imaging element 11 with 70° FOV printed on a glass slide and imaged through a microscope. Since the simulated results do not include surface imperfections and scattering, a smaller overall contrast is the most striking difference. FIG. 5b compares the foveated images of imaging elements 11 to 14. Both results exhibit visible improvement in level of detail for the central part. If the pixelation effects of the image sensor are taken into account, all images loose information. FIG. 5c displays the simulation results of imaging element 11 if a pixel size of 1.4 µm is assumed and compares it to the data attained on the chip. Due to the fact that the chip does not perfectly transfer the image, there is a notable difference in image quality. This effect can be explained by the chip plane being not perfectly aligned with the focal plane and due to the fact that the micro lens array on the chip, important for the imaging perfomance, was removed prior to 3D-printing. The resulting foveated images are shown in FIG. 5d. As in FIGS. 5a to 5c, the simulation result is shown on the top while the measurement result is shown on the bottom. As can be seen in FIG. 5d compared to FIGS. 5a to 5c, the imaging resolution is considerably increased towards the center of the images. Although the measured image does not completely achieve the quality of the simulated one, significant improvement is visible. A further improvement of the image quality and an increase of the information content in a smoothly varying fashion may be achieved by using more advanced image fusion algorithms.

Figure 6:
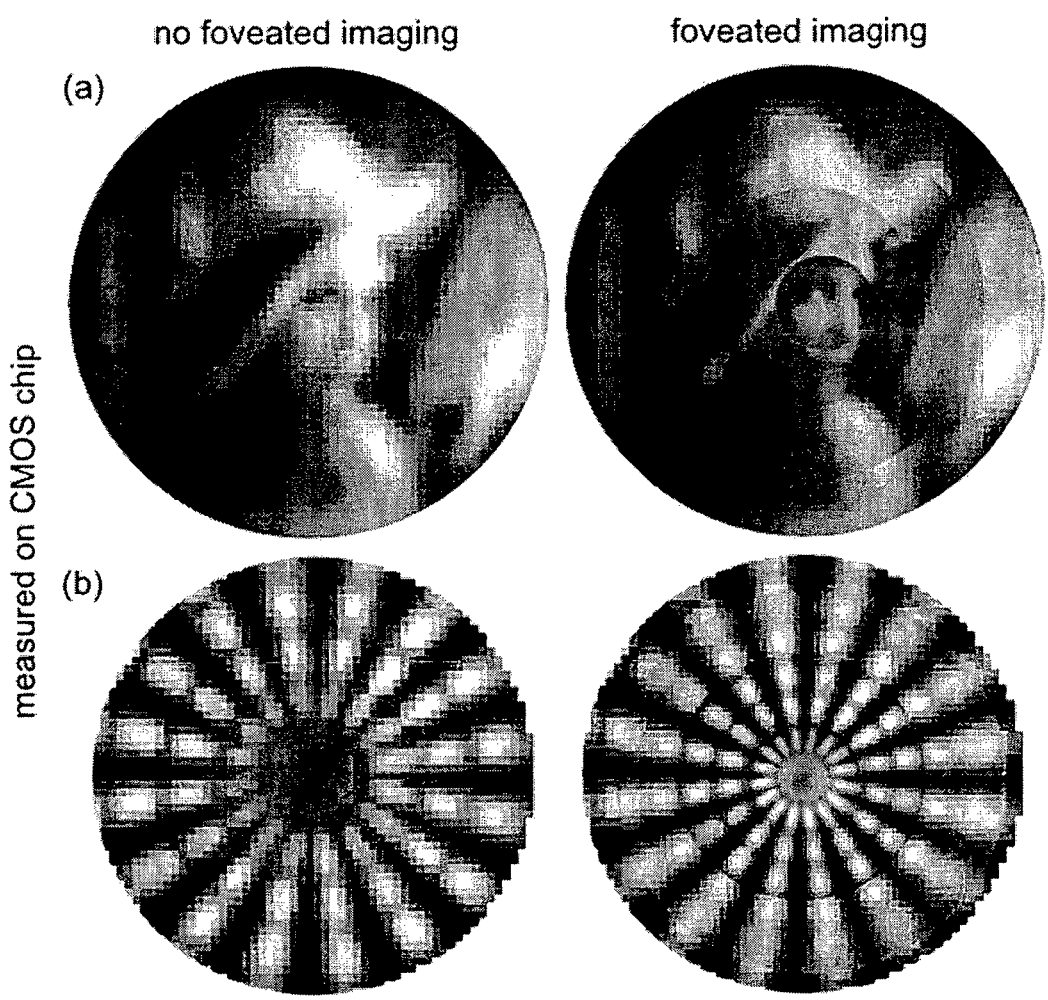
FIG. 6 is a photograph showing a comparison of the 70° FOV image with its foveated equivalents after 3D-printing on the chip. In particular.

To further demonstrate the potential of the present invention, the test image "Lena" as well as a Siemens star have been used as targets, as illustrated in FIG. 6. In both examples, the center of the original images contains more information than the outer parts. Using the foveated approach, the totally available bandwidth is optimized such that the important parts (center) are transferred with a higher spatial bandwidth (resolution) compared to the less important outer areas in the pictures. The results confirm strikingly that the multi-aperture system according to the present invention delivers superior images.

The employed 3D-printing technology is almost unrestricted in terms of fabrication limitations. This offers high degrees of freedom and unique opportunities for the optical design. However, finding the optimum system becomes more difficult, since the parameter space is much less constrained as compared to many classical design problems. Due to the mature one-step fabrication process, the challenges of the development are, in comparison to competing manufacturing methods—thus shifted from technology towards the optical design.

To ensure an efficient use of the available space, four different two-lens systems (imaging elements) are designed with full FOVs of 70°, 60°, 40°, and 20°. The numbers have been chosen based on the achievable performance in previous experiments and such that each lens contributes to the foveated image with similarly sized sections of the object space. Table 1 shows an overview of the resulting parameters. It is noted that these parameters are only presented as examples. Since the lens stacks and support material are all fully transparent, it is important to keep the aperture stop on the front surface during design. Otherwise, light refracted and reflected by the support structures would negatively influence the imaging performance. Buried apertures inside the lenses are not possible until now because absorptive layers can not be implemented by femtosecond 3D-printing. Due to the scaling laws of optical systems, small f-numbers can be easily achieved. The aperture diameter may be 100 µm for all lenses. As a restriction, the image circle diameter may be set to 90 µm.

TABLE 1

Selected parameters of the designed lens systems

|  | Lens 1 | Lens 2 | Lens 3 | Lens 4 |
| --- | --- | --- | --- | --- |
| FOV | 70° | 60° | 40° | 20° |
| visible object diameter at 1 m distance | 2.75 m | 1.73 m | 0.84 m | 0.36 m |
| focal length | 64.6 µm | 78.3 µm | 123.9 µm | 252.2 µm |
| f number | 0.7 | 0.8 | 1.2 | 2.6 |
| hyperfocal | 6.4 mm | 7.2 mm | 8.1 mm | 7.3 mm |

TABLE 1-continued

Selected parameters of the designed lens systems

| | Lens 1 | Lens 2 | Lens 3 | Lens 4 |
|---|---|---|---|---|
| distance | | | | |
| Fresnel number at $\lambda$ = 550 nm | 70 | 58 | 36.7 | 18 |
| 35 mm equivalent focal length | 31 mm | 38 mm | 60 mm | 123 mm |

Before simulation and optmization, it is important to determine the best suited method. The Fresnel numbers of all systems indicate that diffraction does not significantly influence the simulation results. Therefore, geometric optics and standard raytracing can be used to design the different lenses. As an example, the commercial raytracing software ZEMAX may be used. Since the fabrication method by 3D-printing poses no restrictions for the surface shape, aspheric interfaces up to $10^{th}$ order are used. As refractive medium, the photoresist IP-S of the company Nanoscribe GmbH, Eggenstein-Leopoldshafen, Germany has been implemented based on previously measured dispersion data. After local and global optimization, the resulting designs reveal diffraction limited performance (Strehl ratio <0.8) for most of the lenses and field angles. The raytracing design has been finalized polychromatically with a direct optimisation of the modulation transfer function (MTF) which includes diffraction effects at the apertures.

Compared to conventional single-interface microlenses, the close stacking of two elements offers significant advantages and is crucial for the imaging performance. On the one hand, pupil positions and focal lengths can be changed independently which allows for real telephoto and retrofocus systems. On the other hand, aberrations such as field curvature, astigmatism, spherical aberration, and distortion can be corrected effectively.

After the optical design, the final results are transferred to a computer aided design (CAD) software. In terms of support structure design it is important to find a good trade-off between rigidity and later developability of the inner surfaces. So far, the best results have been achieved with open designs based on pillars, as shown in FIG. 3. All of the lens fixtures have an outer diameter of 120 µm.

Figure 7:
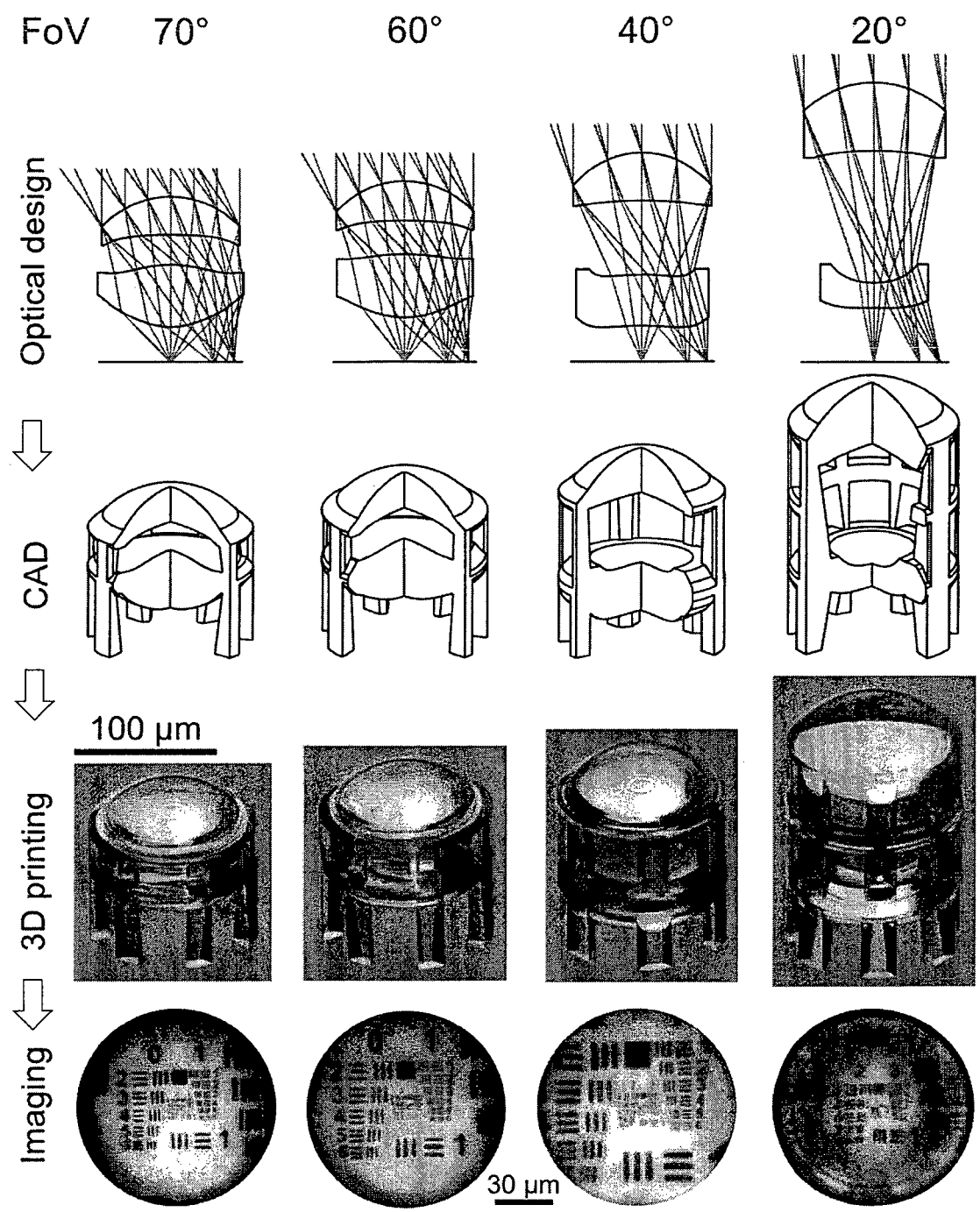
FIG. 7 shows the development cycle of different lens systems with fields of view (FOV) varying between 20° and 70°. The process chain can be separated (from top to bottom) into optical design, mechanical design, 3D-printing, and measurement of the imaging performance using an USAF 1951 test target.

FIG. 7 shows the different stages of the development process. To measure the imaging performance, samples have been 3D-printed onto glass substrates as well as onto a CMOS imaging sensor (Omnivision 5647). This chip offers a pixel pitch of 1.4 µm which results in single images with ~3240 pixels. Using a state-of-the-art sensor with 1.12 µm pixel pitch would increase this number to ~5071 pixels.

To improve the adhesion of the lenses, the color filter and microlens array on the sensor had to be removed before the 3D-printing.

To charaterize the optical performance without pixelation effects, the four different compound lenses are printed onto glass slides. Since the lenses have been designed for imaging from infinity and their focal lengths are smaller than 260 µm, the hyperfocal distance is about 8 mm and objects further away always remain focused. To assess the imaging quality, the intermediate image formed by the lenses is reimaged with an aberration corrected microscope. Measurements of the modulation transfer function (MTF) based on imaging a knife edge were performed in the same way as described before.

The foveated camera performance has been evaluated after 3D-printing on the image chip. The sensor device has been placed in 70 mm distance from a target which consists of different patterns printed onto white paper. The target has been illuminated from the backside with an incoherent white light source. The image data from the chip was then read out directly. It has to be noted that the chip and the read out software automatically performed some operations with the images such as color balance or base contrast adjustment. However, there were no edge enhancment algorithms used which would have skewed the displayed results. Due to their different f-numbers, all lenses lead to a different image brightness. To compensate for this effect, the illumination optics have been adjusted such that approximately the same optical power is transferred to the image for all four imaging elements.

In summary, the present disclosure demonstrates direct 3D-printing of varying complex multi-component imaging systems onto a chip to form a multi-aperture camera. In particular, four different air-spaced doublet lenses to obtain a foveated imaging system with a FOV of 70° and angular resolutions of >2 cycles/degree in the center of the image are combined. Only the chip dimensions and pixel size limit the overall systems dimensions and the optical performance at the moment. Thus, devices can become smaller than 300×300×200 µm³ in volume and at the same time transfer images with higher resolution. The present invention thus provides improved imaging systems in terms of miniaturization, functionality and imaging quality as compared to the state of the art.

LIST OF REFERENCE NUMERALS

1 image sensor (CMOS- or CCD-sensor)
11 imaging element (3D-printed)
11a lens
11b lens
12 imaging element (3D-printed)
12a lens
12b lens
13 imaging element (3D-printed)
13a lens
13b lens
14 imaging element (3D-printed)
14a lens
14b lens
15 discharge opening
20 curve of MTF contrast for a 20° FOV imaging element
20a theoretical resolution limit due to pixel pitch for a 20° FOV imaging element
21 curve of MTF contrast for a 40° FOV imaging element
21a theoretical resolution limit due to pixel pitch for a 40° FOV imaging element
22 curve of MTF contrast for a 60° FOV imaging element
22a theoretical resolution limit due to pixel pitch for a 60° FOV imaging element
23 curve of MTF contrast for a 70° FOV imaging element
23a theoretical resolution limit due to pixel pitch for a 70° FOV imaging element
100 multi-aperture system or camera for foveated imaging/foveated imaging system

The invention claimed is:
1. A method of fabricating a multi-aperture system for foveated imaging, the method comprising:
    positioning an image sensor; and
    forming, using a 3D-printing technique, at least two imaging elements adapted for foveated imaging directly on the image sensor, wherein the at least two imaging elements have a common focal plane located on the image sensor and each of the at least two imaging elements has a different focal length and field of view.

2. The method of claim 1, wherein the forming of the at least two imaging elements is performed in one single 3D-printing step.

3. The method of claim 1, wherein the forming of the at least two imaging elements comprises forming at least one discharge opening in each imaging element so that an unexposed photoresist is able to discharge after the 3D-printing.

4. The method of claim 1, wherein the forming of the at least two imaging elements comprises forming at least two multiple-lens objectives.

5. The method of claim 1, wherein the method further comprises a pre-processing of the image sensor before the at least two imaging elements are formed, and wherein the pre-processing comprises a removal of functional elements that are disposed on the image sensor.

6. The method of claim 1,
wherein the at least two imaging elements are formed such that each of the at least two imaging elements has dimensions of less than 800 µm, and/or
wherein the at least two imaging elements are formed such that each of the at least two imaging elements occupies an area on the image sensor that is smaller than $\pi*400^2$ µm$^2$.

7. The method of claim 1, wherein the forming of the at least two imaging elements comprises forming four imaging elements that are arranged in a 2×2 arrangement, and wherein the four imaging elements are formed such that they occupy a total area on the image sensor of less than 1000×1000 µm$^2$.

8. The method of claim 1, wherein the image sensor is a CCD-sensor or a CMOS-sensor.

9. A multi-aperture system for foveated imaging, comprising:
an image sensor; and
at least two imaging elements adapted for foveated imaging which are directly formed on the image sensor using a 3D-printing technique, wherein the at least two imaging elements have a common focal plane located on the image sensor and each imaging element has a different focal length and field of view.

10. The multi-aperture system of claim 9, wherein the image sensor is a CCD-sensor or a CMOS-sensor.

11. The multi-aperture system of claim 9, wherein each imaging element comprises at least one discharge opening so that an unexposed photoresist is able to discharge after the 3D-printing.

12. The multi-aperture system of claim 9,
wherein each of the at least two imaging elements has dimensions of less than 800 µm, and/or
wherein each of the at least two imaging elements occupies an area on the image sensor that is smaller than $\pi*400^2$ µm$^2$.

13. The multi-aperture system of claim 9, wherein the at least two imaging elements comprise four imaging elements arranged in a 2×2 arrangement, wherein the four imaging elements occupy a total area on the image sensor of less than 1000×1000 µm$^2$.

14. The multi-aperture system of claim 9, further comprising a processor useable for processing individual images captured by the at least two imaging elements.

15. The multi-aperture system of claim 14, wherein the processor is configured to process the individual images and generate a resulting image such that in a central area of the resulting image the information density is higher compared to a peripheral area of the resulting image.

* * * * *